(12) United States Patent
Kurata et al.

(10) Patent No.: US 7,799,688 B2
(45) Date of Patent: Sep. 21, 2010

(54) POLISHING FLUID AND METHOD OF POLISHING

(75) Inventors: Yasushi Kurata, Hitachi (JP); Yasuo Kamigata, Tsukuba (JP); Sou Anzai, Hitachi (JP); Hiroki Terazaki, Hitachi (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 1388 days.

(21) Appl. No.: 10/517,049

(22) PCT Filed: May 29, 2003

(86) PCT No.: PCT/JP03/06769
§ 371 (c)(1),
(2), (4) Date: Dec. 3, 2004

(87) PCT Pub. No.: WO03/103033
PCT Pub. Date: Dec. 11, 2003

(65) Prior Publication Data
US 2005/0173669 A1 Aug. 11, 2005

(30) Foreign Application Priority Data
Jun. 3, 2002 (JP) .............................. 2002-161327

(51) Int. Cl.
*H01L 21/302* (2006.01)
(52) U.S. Cl. .......................... 438/692; 438/693; 216/89
(58) Field of Classification Search .................. 216/88, 216/89, 90; 438/692, 693; 252/79.1–79.5; 51/307; 451/36, 287
See application file for complete search history.

(56) References Cited

U.S. PATENT DOCUMENTS

| 4,944,836 | A | | 7/1990 | Beyer et al. | |
|---|---|---|---|---|---|
| 4,954,142 | A | * | 9/1990 | Carr et al. ...................... | 51/309 |
| 5,391,258 | A | * | 2/1995 | Brancaleoni et al. .......... | 216/89 |
| 5,476,606 | A | * | 12/1995 | Brancaleoni et al. ....... | 252/79.1 |
| 5,770,095 | A | * | 6/1998 | Sasaki et al. ................. | 216/38 |
| 6,217,416 | B1 | * | 4/2001 | Kaufman et al. .............. | 451/41 |
| 6,315,803 | B1 | | 11/2001 | Ina et al. | |
| 6,355,075 | B1 | | 3/2002 | Ina et al. | |
| 6,426,294 | B1 | * | 7/2002 | Hirabayashi et al. ........ | 438/690 |
| 6,447,371 | B2 | * | 9/2002 | Brusic Kaufman et al. .... | 451/36 |
| 6,599,837 | B1 | * | 7/2003 | Merchant et al. ............ | 438/692 |
| 6,653,267 | B2 | | 11/2003 | Yano et al. | |
| 7,118,685 | B1 | * | 10/2006 | Yoneda et al. ............. | 252/79.1 |
| 2002/0189169 | A1 | * | 12/2002 | Costas et al. .................. | 51/307 |
| 2004/0023492 | A1 | * | 2/2004 | Bian et al. .................. | 438/689 |
| 2004/0065022 | A1 | * | 4/2004 | Machii et al. ................. | 51/309 |
| 2005/0181609 | A1 | * | 8/2005 | Kurata et al. ................ | 438/689 |
| 2006/0037251 | A1 | | 2/2006 | Kurata et al. | |
| 2006/0163530 | A1 | * | 7/2006 | Liu ........................... | 252/79.1 |
| 2007/0045233 | A1 | * | 3/2007 | Yoneda et al. ................ | 216/88 |
| 2007/0232197 | A1 | * | 10/2007 | Amanokura et al. .......... | 451/37 |
| 2008/0003924 | A1 | * | 1/2008 | Kurata et al. ................. | 451/36 |

FOREIGN PATENT DOCUMENTS

| EP | 1 125 999 A1 | 8/2001 |
|---|---|---|
| EP | 1 167 482 A2 | 1/2002 |
| JP | 02-278822 | 11/1990 |
| JP | 08-83780 | 3/1996 |
| JP | 2819196 | 8/1998 |
| JP | 11-135467 | 5/1999 |
| JP | 2000-158329 | 6/2000 |
| JP | 2000-340532 | 12/2000 |
| JP | 2001-031953 | 2/2001 |
| JP | 2001-089747 A | 4/2001 |
| JP | 2001-144044 A | 5/2001 |
| JP | 2001-176826 | 6/2001 |
| JP | 2001-247853 A | 9/2001 |
| JP | 2001-291684 | 10/2001 |
| WO | WO 94/28194 | 5/1994 |
| WO | WO 01/13417 | 2/2001 |
| WO | 01/30928 A1 | 5/2001 |

OTHER PUBLICATIONS

Chinese Office Action dated Dec. 15, 2006, issued in corresponding Chinese Patent Application No. 038127830.
Japanese Office Action dated Mar. 11, 2008 (mailing date), issued in corresponding Japanese Patent Application No. 2004-510020.
F. B. Kaufman et al.; Journal of the Electrochemical Society, vol. 138, No. 11, pp. 3460-3465, Nov. 1991. Cited in the specification.
Chinese Office Action dated Jul. 31, 2009 (issue date), issued in corresponding Chinese Patent Application No. 2007101074430.
Chinese Office Action dated Feb. 5, 2010, issued in corresponding Chinese Patent Application No. 2007101074426.
Japenese Office Action dated Apr. 27, 2010, issued in corresponding Japanese Patent Application No. 2004-510020.

\* cited by examiner

*Primary Examiner* — Lan Vinh
(74) *Attorney, Agent, or Firm* — Westerman, Hattori, Daniels & Adrian, LLP

(57) ABSTRACT

A polishing slurry comprises a metal-oxidizing agent, a metal anticorrosive agent, an oxidized metal dissolving agent and water. The oxidized metal dissolving agent is at least one kind selected from the group consisting of an acid in which the negative value of the logarithm of the dissociation constant Ka (pKa) of a first dissociable acid group is 3.5 or more, an ammonium salt of the acid and an organic acid ester of the acid. The pH of the polishing slurry is within the range of 3 to 4. The concentration of the metal-oxidizing agent is within the range of 0.01 to 3 percent by weight. In the wiring-formation process of the semiconductor device, the conductor used for the barrier layer can be polished at a high polishing rate by using the polishing slurry having the low polishing particle concentration and the low metal anticorrosive agent concentration.

11 Claims, No Drawings

POLISHING FLUID AND METHOD OF POLISHING

BACKGROUND OF THE INVENTION

1. Field of the Invention

The present invention relates to a polishing slurry, and particularly, a polishing slurry used for polishing in the wiring-formation process of a semiconductor device, and a polishing method using the polishing slurry.

2. Description of the Related Art

Recently, as a Large-Scale Integrated circuit (hereinafter, referred to as "LSI") of a semiconductor advances to fulfil the demand of higher integration and performance, new microprocessing techniques have been developed. The Chemical Mechanical Polishing (hereinafter, referred to as "CMP") method is one of the new microprocessing techniques, which is often used in a LSI production process, especially for flattening interlaminar insulating films, formation of a metal plug and embedded wires in a multi-layered wiring-formation process. This technique is disclosed in U.S. Pat. No. 4,944,836.

Additionally, in recent years, use of copper and copper alloy as a wire material has been mainly attempted in order to enhance the performance of LSI. However, in the case of the copper and the copper alloy, it is difficult to perform microprocessing according to dry etching, which has been often used in the conventional method for forming aluminum alloy wiring. Therefore, there has been employed what is called Damascene method in which copper or a thin film of copper alloy is accumulated on and embedded in an insulating film by way of a groove formed in advance on the insulating film and then the copper or the copper alloy thin film remaining at the portions other than the groove portion is removed by CMP, whereby embedded wiring is formed. For instance, this technique is disclosed in Japanese Patent Application Laid-Open (JP-A) No. 2-278822.

In general, a CMP method in metal processing such as copper and a copper alloy includes the steps of: sticking a polishing pad on a disc-shaped polishing platen; soaking the surface of the polishing pad with a polishing liquid for metal; pressing, one surface of a substrate on which a metal film has been formed, against the surface of the polishing pad, with applying a predetermined pressure (hereinafter, referred to as "polishing pressure") thereon from the back surface of the substrate, and rotating the polishing platen in that state; and removing the projected portion of the metal film by utilizing mechanical friction between the polishing liquid and the projected portion of the metal film.

The polishing liquid for metal used for CMP generally contains a metal-oxidizing agent and solid polishing particles. An oxidized metal dissolving agent and a metal anticorrosive agent are further added thereto, according to necessity. With regards to the basic mechanism of CMP, it is assumed that at first the surface of the metal film is oxidized by an oxidizing agent; and then the oxidized layer is scraped off by the solid polishing particles. The oxidized layer existing at the dented portion of the metal surface is hardly brought into contact with the polishing pad and thus the solid polishing particles do not have so much scraping effect thereon. In other words, the metal layer present at the projected portion of the substrate surface is removed as CMP is effected, whereby the substrate surface is made flat and smooth. The details of the feature described above is disclosed in Journal of Electrochemical Society, vol. 138, No. 11 (1991), pp. 3460-3464.

It has been known that addition of an oxidized metal dissolving agent is effective as a method for increasing the polishing rate by CMP. It is understood that addition of an oxidized metal dissolving agent is effective because the scraping effect by the solid polishing particles is enhanced by dissolving (hereinafter, referred to as "etching") the particles of metal oxides, which have been scraped off by the solid polishing particles, in the polishing liquid. The polishing rate due to CMP is increased by adding the oxidized metal dissolving agent. However, if the oxidized layer existing at the dented portion of the metal film surface is also etched and the metal film surface is exposed, the metal film surface is further oxidized by the oxidizing agent. In a case in which such excessive etching is repeated, the metal film at the dented portion is considerably etched. Thereby, a phenomenon (hereinafter, referred to as "dishing") is occurred in which the center portion at the surface of the embedded metal wiring is recessed like a dish after polishing, and the flattening effect is damaged.

In order to prevent such excessive etching from being occurred, a metal anticorrosive agent for protecting the metal surface further is added. The metal anticorrosive agent forms a protective film on the oxidized layer of the metal film surface, and prevents the oxidized layer from solving in the polishing slurry. This protective film can be scraped off easily by the solid polishing particles, and the polishing rate due to CMP is preferably maintained.

In order to suppress dishing and etching of copper and copper alloy during polishing and form highly reliable LSI wiring, there has been proposed a method for using a polishing liquid for metal containing: an oxidized metal dissolving agent composed of an amino acetic acid (such as glycine) or amido sulfuric acid; and BTA (benzotriazol) as the metal anticorrosive agent. This technique is disclosed, for example, in JP-A No. 8-83780.

In the Damascene wiring formation of copper or copper alloy or the metal-embedding formation such as plug wiring formation of tungsten or the like, if the polishing rate of the silicon dioxide film as the interlaminar insulating film formed at the portion other than the embedded portion is also large, there arises the phenomenon of "thinning" in which reduction of wiring thickness and reduction of thickness of the interlaminar insulating film simultaneously occur. As a result, since there is generated variation in resistance due to the increase in the wiring resistance, the pattern density or the like, a characteristic that the polishing rate of the silicon dioxide film is sufficiently smaller than that of the metal film to be polished is required. Therefore, there has been proposed a method in which pH of the polishing liquid is made higher than the negative value of the logarithm of the dissociation constant Ka (pKa) of the first dissociable acid group of an oxidized metal dissolving agent −0.5 by suppressing the polishing rate of silicon dioxide by the action of an anion produced as a result of dissociation of an acid. This technique is disclosed, for example, in Japanese Patent No.2819196.

As a lower layer beneath metal for wiring portion such as copper or copper alloy, a barrier layer of a conductor selected from the group, for example, consisting of tantalum, tantalum alloy, tantalum nitride and tantalum compounds of other types (hereinafter, referred to as "tantalums") is formed in order to prevent copper from diffusing into the interlaminar insulating film and enhance the adhesion. Accordingly, at the portion other than the wiring portion at which copper or copper alloy is to be embedded, the exposed barrier layer must be removed by CMP. However, as the barrier layer conductor is harder than copper or copper alloy, a sufficiently high polishing rate is hardly obtained and flatness often worsens, even if a combination of the polishing materials for copper or copper alloy is simply employed. Therefore, there has been studied a two-stage polishing method including the first step of polishing metal for wiring portion and the second step of polishing the barrier layer conductor.

The conductors generally used as the barrier layer, for example, the above tantalums, titanium and the compound thereof, tungsten and the compound thereof or the like are chemically stable. In addition the etching of the conductors is difficult, and the conductors have high hardness. Thereby, the mechanical polishing thereof is not so easy as that of copper and a copper alloy. When the hardness of the polishing particles is increased, polishing crack is occurred on copper or copper alloy, and the poor electrical property is caused. When the particle concentration of the polishing particles is increased, a problem exists in that the polishing rate of a silicon dioxide film becomes faster, and thinning is occurred.

It has been considered that in CMP of the barrier layer as the second process, the dishing in the embedding wiring portion of copper or copper alloy must be prevented and the low pH of the polishing slurry is minus effect so as to suppress the polishing rate and etching rate of copper or copper alloy. On the other hand, as the polishing slurry which is effective for polishing the barrier layer, the following polishing slurry is proposed. The pH of the polishing slurry is 3 or less and the concentration of the metal-oxidizing agent is within the range of 0.01 to 3.0 percent by weight by adjusting the pH of the polishing slurry and the concentration of the metal-oxidizing agent such that the polishing of tantalums used as the barrier layer conductor is easily advanced in a low pH region and in a low metal-oxidizing agent concentration region (For example, see WO 01/013417).

However, the polishing rate of the barrier layer due to the polishing slurry proposed above is not sufficient as compared with the etching rate and polishing rate of metal for wiring such as copper and copper alloy. A problem exists in that the state (hereinafter, referred to as "corrosion") where a foreign matter is occurred on the oxidized surface to be polished is easily occurred on the metal surface, particularly on the metal for wiring such as copper and copper alloy.

The present inventors have found that the high polishing rate of the conductor used for the above barrier layer in a region where the pH is 3 or more is obtained for the above proposal. At that time, the present inventors have also found that as the kind of the oxidized metal dissolving agent used for pH adjustment, an acid in which pKa of a first dissociable acid group is 3.5 or more and an ammonium salt of the acid are effective.

Since the corrosion operations of the metal for wiring such as copper and copper alloy and the conductor used for the barrier layer are respectively small in a region wherein the pH is 3 or more in the invention, the corrosion of the metal wiring portion is not easily occurred, and the highly reliable LSI wiring can be formed. In addition, in the region where the pH is 3 or more, the etching rate and polishing rate of the metal of the wiring portion can be sufficiently reduced as compared with the polishing rate of the barrier layer, and thereby, dishing or thinning is effectively reduced. The concentration of the metal anticorrosive agent to the metal surface can be also reduced.

It is an object of the invention to provide a polishing slurry which can realize the high polishing rate of the conductor used for the barrier layer in low polishing particle concentration, and can form the embedding pattern of a highly reliable metal film by suppressing the etching operation of the metal for wiring such as copper and copper alloy by reducing the dishing and thinning of the metal wiring. It is another object of the invention to provide a polishing method using the polishing slurry.

SUMMARY OF THE INVENTION

The polishing slurry of the invention relates to the following polishing slurry and polishing method.

(1), That is, the invention relates to a polishing slurry comprising: a metal-oxidizing agent; a metal anticorrosive agent for protecting metal surface; an oxidized metal dissolving agent; and water, the oxidized metal dissolving agent being at least one kind selected from the group consisting of an acid in which the negative value of the logarithm of the dissociation constant Ka (pKa) of a first dissociable acid group is 3.5 or more, an ammonium salt of the acid and an organic acid ester of the acid, the pH of the polishing slurry being within the range of 3 to 4, the concentration of the metal-oxidizing agent being within the range of 0.01 to 3 percent by weight.

(2) The invention relates to the polishing slurry of the (1), wherein the concentration of the oxidizing agent is within the range of 0.01 to 1.5 percent by weight.

(3) The invention relates to the polishing slurry of the (1) or (2), wherein the oxidized metal dissolving agent is an organic acid.

(4) The invention relates to the polishing slurry of the (3), wherein the oxidized metal dissolving agent is at least one kind selected from the group consisting of lactic acid, succinic acid, adipic acid, glutaric acid, benzoic acid, quinaldic acid, butyric acid and valeric acid.

(5) The invention relates to the polishing slurry of any one of (1) to (4), wherein the metal anticorrosive agent is at least one kind selected from the group consisting of a compound having a triazole skeleton other than benzotriazole, a compound having a pyrimidine skeleton, a compound having an imidazole skeleton, a compound having a guanidine skeleton, a compound having a thiazole skeleton, a compound having a pyrazole skeleton and benzotriazole.

(6) The invention relates to the polishing slurry of any one of the (1) to (5), wherein the metal-oxidizing agent is at least one kind selected from the group consisting of hydrogen peroxide, ammonium persulfate, ferric nitrate, nitric acid, potassium periodate, hypochlorous acid and ozone water.

(7) The invention relates to the polishing slurry of any one of (1) to (6), wherein the polishing slurry contains polishing particles.

(8) The invention relates to the polishing slurry of the (7), the polishing particles are at least one kind selected from the group consisting of silica, alumina, ceria, titania, zirconia and germania.

(9) The invention relates to the polishing slurry of the (7) or (8), wherein the polishing particles are colloidal silica or colloidal alumina having an average particle diameter of 100 nm or less.

(10) The invention relates to the polishing slurry of any one of the (1) to (9), wherein the polishing slurry contains a water-soluble polymer compound.

(11) The invention relates to the polishing slurry of the (10), wherein the water-soluble polymer compound is at least one kind selected from the group consisting of polyacrylic acid and the salt thereof, polymethacrylic acid and the salt thereof, polyacrylamide, polyvinyl alcohol, and polyvinylpyrrolidone.

(12) The invention relates to a polishing method comprising: a first polishing step of polishing a conductive substance layer of a substrate having an interlaminar insulating film of which the surface consists of dented portions and projected portions, a barrier conductor layer coating the interlaminar insulating film along the surface thereof, and the conductive substance layer with which the dented portions are filled up and coats the barrier conductor layer to expose the barrier conductor layer of the projected portions; and a second polishing step of polishing chemically and mechanically polishing at least the barrier conductor layer and the conductive substance layer of the dented portions while supplying the polishing slurry of any one of the (1) to (11) to expose the interlaminar insulating film of the projected portions.

(13) The invention relates to the polishing method of the (12), wherein the barrier conductor layer prevents the conductive substance from diffusing to the interlaminar insulating film, and the conductive substance is at least one of copper and a copper alloy.

(14) The invention relates to the polishing method of the (12) or (13), wherein the barrier conductor layer is a single layer made of one kind or a lamination layer made of two kinds or more selected from the group consisting of tantalum, tantalum nitride, a tantalum alloy, titanium, titanium nitride, a titanium alloy, tungsten, tungsten nitride and a tungsten alloy.

DESCRIPTION OF THE PREFERRED EMBODIMENTS

Hereinafter, the invention will be explained in detail. The polishing slurry of the invention contains the metal-oxidizing agent, the metal anticorrosive agent for protecting metal surface, the oxidized metal dissolving agent and water as a main constituent.

Hereinafter, It will be noted that the composition of the conductor used for the barrier layer polished by the polishing slurry is tantalums and the metal composition for wiring is copper or a copper alloy. However, the polishing slurry is similarly applied for the case that other composition usually used, for example, the conductor is titanium compounds such as titanium, titanium nitride, a titanium alloy, tungsten compounds such as tungsten, tungsten nitride and a tungsten alloy, and the case that the metal for wiring is a copper oxide, a copper alloy oxide, tungsten, a tungsten alloy, silver and gold or the like.

Examples of the metal-oxidizing agents in the polishing slurry of the invention include hydrogen peroxide, ammonium persulfate, ferric nitrate, nitric acid, potassium periodate, hypochlorous acid and ozone water. Particularly, hydrogen peroxide is preferable. These may be used alone or combination of more kinds thereof. In the case in which the substrate is a silicon substrate containing an element for a integrated circuit, an oxidizing agent which does not contain nonvolatile components is preferable, so that undesirable pollution caused by alkali metal, alkali earth metal, halides or the like can be avoided. Ozone water exhibits rapid change in the composition thereof in a period of time. Accordingly, hydrogen peroxide is the most preferable as the oxidizing agent. However, if the substrate to be polished is a glass substrate which does not contain a semiconductor element, an oxidizing agent containing nonvolatile components may also be acceptable.

The concentration of the metal-oxidizing agent of the invention must be within the range of 0.01 to 3 percent by weight in the polishing slurry, more preferably 0.01 to 1.5 percent by weight, and most preferably 0.1 to 1.0 percent by weight. When the concentration of the oxidizing agent is less than 0.01 percent by weight, the effect of addition is reduced, and the sufficient polishing rate of tantalums cannot be obtained. On the other hand, when the concentration is more than 3 percent by weight, the etching rate of metal such as copper and a copper alloy is increased, and thereby, the problem of corrosion is easily generated. Also, the polishing rate of tantalums also tends to be reduced.

Generally, when the pH is low, the etching rates of copper film and a copper alloy film are large, and it is difficult to suppress the etching due to the metal anticorrosive agent. However, since the concentration of the metal-oxidizing agent is sufficiently low in the invention, the etching can be suppressed due to the metal anticorrosive agent.

The oxidized metal dissolving agent of the invention is at least one kind selected from the group consisting of an acid in which the negative value of the logarithm of the dissociation constant Ka (pKa) of a first dissociable acid group is 3.5 or more, an ammonium salt of the acid and an organic acid ester of the acid. There are no particular limitations as long as the oxidized metal dissolving agent is water-soluble. However, organic acids are preferable in view of the etching properties of the metal, and examples of the organic acids include lactic acid, succinic acid, adipic acid, glutaric acid, benzoic acid, quinaldic acid, butyric acid, valeric acid, salicylic acid, glyceric acid and pimelic acid. Of these, lactic acid, succinic acid, adipic acid, glutaric acid, benzoic acid, quinaldic acid, butyric acid and valeric acid or the like are more preferable. The other examples include the ammonium salt of these acids and the organic acid ester thereof. It is also effective to use together at least two kinds of acids, ammonium salts or organic acid esters because the etching rate can be effectively suppressed with maintaining a high, practically acceptable CMP rate.

Preferable examples of the organic acid esters include alkyl ester such as methyl ester, ethyl ester, 1-propyl ester, 2-propyl ester, 1-butyl ester, 2-butyl ester, 3-butyl ester, tert-butyl ester. Methyl ester, ethyl ester, 1-propyl ester and 2-propyl ester are more preferable. The practical polishing rate of tantalums can be obtained in the region where the pH of the polishing slurry is within the range of 3 to 4 by using the acid in which the dissociation constant (pKa) of the first dissociable acid group is 3.5 or more, the ammonium salt of the acid or the organic acid ester of the acid.

The pH of the polishing slurry of the invention must be within the range of 3 to 4. In order to obtain a higher polishing rate of tantalums, the pH is preferably within the range of 3 to 3.75, and the pH is more preferably within the range of 3 to 3.5. In order to suppress the etching rate of metal such as copper and a copper alloy as compared with the polishing rate of tantalums, superior characteristic is obtained in the range where the pH is within the range of 3 to 4 than the range where the pH is less than 3. Though the region where the pH is more than 4 is very effective for suppressing the etching operation, the practical polishing rate of tantalums is not obtained.

When the pH is set to higher than 4 by the concentration or the like of the oxidized metal dissolving agent, the decomposition of the oxidizing agent such as hydrogen peroxide is promoted, and a secondary oxidized layer which is harder to be polished than a primary oxidized layer is formed on the film surface of the tantalums. Thereby, the polishing rate is easily reduced.

The pH of the polishing slurry of the invention can be adjusted by the amount of addition of the acid. The pH can be also adjusted by adding alkali components such as ammonia, sodium hydroxide and tetramethylammonium hydroxide (TMAH).

The pH of the polishing slurry of the invention is measured by a pH meter (for example, Model PH81 (trade name: manufactured by Yokogawa Electric Co.)). After a two-point calibration is performed by using a standard buffer solution (the pH of a phthalic acid salt pH buffer solution: 4.21 (25° C.) and the pH of a neutral phosphoric acid salt pH buffer solution:

6.86 (25° C.)), an electrode is put into the polishing slurry, and a stabilized value after elapse of 2 minutes or more is measured.

There are no particular limitations as long as the metal anticorrosive agent of the invention forms the protective film on the oxidized layer of the surface of the metal film, and prevents the oxidized layer from solving in the polishing slurry. At least one kind is preferably selected from the group consisting of a compound having a triazole skeleton other than benzotriazole, a compound having a pyrimidine skeleton, a compound having an imidazole skeleton, a compound having a guanidine skeleton, a compound having a thiazole skeleton, a compound having a pyrazole skeleton and benzotriazole (BTA). It is also effective to use kinds of two or more together from these.

Examples of the compounds having the triazole skeleton include 1,2,3-triazole, 1,2,4-triazole, 3-amino-1H-1,2,4-triazole, benzotriazole, 1-hydroxybenzotriazole, 1-dihydroxypropylbenzotriazole, 2,3-dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole buryl ester, 4-carboxyl(-1H-)benzotriazole octyl ester, 5-hexyl benzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl] phosphonic acid, 3-aminotriazole and 5-methyl benzotriazole. Of these, in view of the polishing rate and the etching rate, 1,2,3-triazole, 1,2,4-triazole, 3-amino-1H-1,2,4-triazole, 4-amino-4H-1,2,4-triazole, benzotriazole, 1-hydroxybenzotriazole and 5-methybenzotriazole are more preferable. These may be used alone or combination of more kinds thereof.

Examples of the compounds having the imidazole skeleton include 2-methylimidazole, 2-ethylimidazole, 2-isopropylimidazole, 2-propylimidazole, 2-butylimidazole, 4-methylimidazole, 2,4-dimethylimidazole, 2-ethyl-4-methylimidazole, 2-undecylimidazole and 2-aminoimidazole. These may be used alone or combination of more kinds thereof.

Examples of the compounds having the pyrimidine skeleton include pyrimidine, 1,2,4-triazolo[1,5-a]pyrimidine, 1,3,4,6,7,8-hexahydro-2H-pyrimido[1,2-a]pyrimidine, 1,3-diphenyl-pyrimidine-2,4,6-trione, 1,4,5,6-tetrahydropyrimidine, 2,4,5,6-tetraaminopyrimidinesulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetamidepyrimidine, 2-aminopyrimidine, 2-methyl-5,7-diphenyl-(1,2,4)triazolo(1,5-a)pyrimidine, 2-methylsulfanilyl-5,7-diphenyl(1,2,4)triazolo(1,5-a)pyrimidine, 2-methylsulfanilyl-5,7-diphenyl-4,7-dihydro-(1,2,4)triazolo (1,5-a) pyrimidine and 4-aminopyrazolo[3,4-d]pyrimidine. Particularly, in view of the polishing rate and the etching rate, 4-aminopyrazolo[3,4-d]pyrimidine, 1,2,4-triazolo(1,5-a)pyrimidine, 2-methyl-5,7-diphenyl-(1,2,4) triazolo(1,5-a)pyrimidine, 2-methylsulfanilyl-5,7-diphenyl-(1,2,4)triazolo(1,5-a)pyrimidine are preferable. These may be used alone or combination of more kinds thereof.

Examples of the compounds having the guanidine skeleton include 1,3-diphenyl guanidine and 1-methyl-3-nitroguanidine. Examples of the compounds having the thiazole skeleton include 2-mercaptobenzothiazole. These may be used alone or combination of more kinds thereof.

The polishing slurry of the invention may contain polishing particles, and the polishing rate of tantalums can be improved by containing the polishing particles. A silicon dioxide film is used as the insulating film layer of copper or a copper alloy wiring such as LSI, in this case, when the silicon dioxide film is polished by using the polishing slurry of the invention after polishing the tantalums as the barrier layer, the polishing slurry preferably contains the polishing particles.

As the polishing particles used in the invention, inorganic polishing particles such as silica, alumina, zirconia, ceria, titania, germania and silicon carbide, and organic polishing particles such as polystyrene, polyacryl and polyvinyl chloride may be used. At least one kind selected from silica, alumina, ceria, titania, zirconia and germania is preferable. Colloidal silica and colloidal alumina which have excellent dispersion stability in the polishing slurry, have the few number of polishing cracks (scratches) generated by CMP and have an average particle diameter of 150 nm or less are preferable. Herein, the average particle diameter of 100 nm or less which increases the polishing rate of the barrier layer is more preferable, and most preferably 70 nm or less. It is noted that the colloidal silica is manufactured by hydrolysis of silicon alcoxide or ion exchange of sodium silicate and the colloidal alumina is manufactured by hydrolysis of aluminium nitrate.

The particle diameter of the polishing particles of the invention is measured by an optical diffraction scattering particle size distribution meter (for example, trade name: COULTER N4SD, manufactured by COULTER Electronics). The measurement conditions of the particle size distribution meter (COULTER N4SD) are the following. The measurement temperature is set to 20° C., and the solvent refractive index is set to 1.333 (water). The particle refractive index is set to Unknown (set), and the solvent viscosity is set to 1.005 cP (water). The Run Time is set to 200 sec, and the laser incidence angle is set to 90 degrees. When the Intensity (corresponding to scattering intensity and turbidity) is higher than 4E+05, the polishing slurry is diluted by water and measured such that the Intensity is within the range of 5E+04 to 4E+05.

The polishing slurry of the invention may contain a water-soluble polymer compound. As the water-soluble polymer compound used in the invention, at least one kind is suitably selected from the group consisting of a polymer which contains a monomer having a carboxyl group such as polyacrylic acid, polyacrylic acid ammonium salt, polyacrylic acid sodium salt, polymethacrylic acid, polymethacrylic acid ammonium salt, polymethacrylic acid sodium salt and polyacrylamide as the basic constitutional unit; and a polymer which contains a monomer having a vinyl group such as polyvinyl alcohol and polyvinylpyrrolidone as the basic constitutional unit. Particularly, the water-soluble polymer compound is preferably at least one kind selected from the group consisting of polyacrylic acid and the salt thereof, polymethacrylic acid and the salt thereof, polyacrylamide, polyvinyl alcohol and polyvinylpyrrolidone.

In the case in which the substrate is a silicon substrate for a semiconductor integrated circuit, a water-soluble polymer is preferably an acid or an ammonium salt thereof, such that undesirable pollution caused by alkali metal, alkali earth metal, halides or the like can be avoided. However, when the substrate is a glass substrate or the like, such restriction as described above is unnecessary.

By adding these water-soluble polymer compounds, the dishing characteristic can be improved by the etching restraining effect due to the metal anticorrosive agent.

The content the metal anticorrosive agent used in the invention is preferably within the range of 0.001 to 5.0 percent by weight based on the total weight of the polishing slurry, more preferably 0.01 to 1.0 percent by weight, and particularly preferably 0.01 to 0.5 percent by weight. When the content is less than 0.001 percent by weight, it tends to be difficult to suppress the etching of the metal. Even when the content is more than 5 percent by weight, there is no difference in the effect, and a problem in that the metal anticorrosive agent is easily re-eluted may be occurred.

The content of the oxidized metal dissolving agent used in the invention is preferably within the range of 0.001 to 10.0 percent by weight based on the total weight of the polishing slurry, more preferably 0.01 to 5.0 percent by weight, and particularly preferably 0.01 to 2.0 percent by weight. When the content is less than 0.001 percent by weight, it is difficult to set the polishing slurry to a predetermined pH value. When the pH is high, the polishing rate tends to be reduced. When the content is more than 10.0 percent by weight, the etching rate is increased while the pH is reduced, and a problem of the corrosion of the metal wiring tends to be occurred.

The content of water may be the remainder, and there are no particular limitations as long as water is contained. The water-soluble polymer compound and the polishing particles are arbitrary ingredients as described above.

When the water-soluble polymer compound is blended, the content of the water-soluble polymer compound is preferably within the range of 0.001 to 0.5 percent by weight based on the total weight of the polishing slurry, and more preferably 0.01 to 0.2 percent by weight. When the content is less than 0.001 percent by weight, the combined use effect with the metal anticorrosive agent tends not to be exhibited for the suppression of etching. When the content is more than 0.5 percent by weight, the polishing rate due to CMP tends to be reduced.

The weight average molecular weight of the water-soluble polymer compound is preferably 500 or more. Though the maximum of the weight average molecular weight is not particularly specified, the weight average molecular weight is preferably 5 million or less are preferred in view of the solubility. When the weight average molecular weight is less than 500, the polishing rate of tantalums tends to be easily reduced. In respect of the etching of copper and a copper alloy, a copolymer obtained by reacting with a polymer compound of which the weight average molecular weight is small having a hydrophobic group is effective.

When the polishing particles are blended, the concentration of the polishing particles is preferably within the range of 0.01 to 20.0 percent by weight based on the total weight of the polishing slurry, more preferably 0.05 to 15.0 percent by weight, and most preferably 0.1 to 8.0 percent by weight. When the concentration of the polishing particles is less than 0.01 percent by weight, the polishing particles adding effect is lost. When the concentration of the polishing particles is more than 20.0 percent by weight, not only the polishing particles are easily flocked, but also there is no difference in the polishing rate.

In the polishing slurry of the invention, when the concentration of the oxidizing agent based on the total weight of the polishing slurry is about 0.15 percent by weight, the polishing rate of tantalums becomes maximized. A primary oxidized layer which is polished easily and mechanically is formed on the film surface of tantalums by the oxidizing agent, and the high polishing rate is obtained.

On the other hand, when the concentration of the oxidizing agent used in the invention is more than 3 percent by weight, the etching rate of metal such as copper and a copper alloy is increased, and thereby, dishing or the like is easily generated. In addition, since the secondary oxidized layer which is harder to be polished than the primary oxidized layer is formed on the film surface of tantalums, the polishing rate is reduced. When the concentration of the oxidizing agent is less than 0.01 percent by weight, the oxidized layer is not sufficiently formed. Thereby, the polishing rate is reduced, and the exfoliation or the like of the film of tantalums may be generated.

The polishing slurry of the invention may contain suitably dispersing agents such as a surface-active agent; pH buffers; colorants such as dyes such as Victoria pure blue, pigments such as phthalocyanine green; and organic solvents such as methanol and ethylene glycol if needed other than the materials described above.

The polishing slurry of the invention can be applied, for example to the formation of a metal wiring layer in a semiconductor device, and can be used for chemical mechanical polishing (CMP) of the conductive substance layer, the conductor layer used as the barrier layer and the interlaminar insulating film.

That is, the polishing method of the invention comprises: a first polishing step of polishing a conductive substance layer of a substrate having an interlaminar insulating film of which the surface consists of dented portions and projected portions, a barrier conductor layer (barrier layer) coating the interlaminar insulating film along the surface thereof, and the conductive substance layer with which the dented portions are filled up and coats the barrier layer to expose the barrier layer of the projected portions; and a second polishing step of polishing chemically and mechanically polishing at least the barrier layer and the conductive substance layer of the dented portions while supplying the polishing slurry of the invention to expose the interlaminar insulating film of the projected portions.

Examples of the conductive substances include substances in which the metal is a main ingredient such as copper, a copper alloy, a copper oxide, an oxide of a copper alloy, tungsten, a tungsten alloy, silver and gold. The conductive substance in which copper is a main ingredient such as copper, a copper alloy, a copper oxide and an oxide of a copper alloy is preferable, and more preferably, at least one of copper and a copper alloy. As the conductive substance layer, a film obtained by forming the substance by the known spatter method and plating method can be used.

The barrier layer applied for the invention is preferably for the above conductive substance, particularly the barrier layer for copper and a copper alloy. The barrier layer is formed in order to prevent the conductive substance from diffusing into an insulating film and enhance the adhesion between the insulating film and the conductive substance. Examples of the composition of the conductor forming the barrier layer include tantalum compounds such as tantalum, tantalum nitride and a tantalum alloy, titanium compounds such as titanium, titanium nitride and a titanium alloy, and tungsten compounds such as tungsten, tungsten nitride and a tungsten alloy. The composition of the conductor is preferably selected from tantalum, tantalum nitride, a tantalum alloy, titanium, titanium nitride, a titanium alloy, tungsten, tungsten nitride and a tungsten alloy. The barrier layer may have a single layer structure consisting of one kind or a lamination layer structure consisting of two kinds or more.

Examples of the interlaminar insulating films include a silicone based coating film and an organic polymer film. Examples of the silicone based coating films include silicon dioxide, fluoro silicate glass, organosilicate glass obtained by using trimethylsilane and dimethoxydimethylsilane as a starting material, silicon oxynitride, silica based coating films such as hydrogenated silsesquioxane, silicon carbide and silicon nitride. Examples of the organic polymer films include all aromatic low dielectric constant interlaminar insulating film.

Particularly, organosilicate glass is preferable. These films are formed by a CVD method, a spin coat method, a dip coat method or a spray method.

In the polishing method of the invention, as a polishing machine, a generally-used polishing machine which includes a holder for holding a substrate having the surface to be polished and a polishing platen having a polishing pad stacked thereon and a motor or the like mounted thereon whose speed of rotation is adjustable can be used when the substrate is polished by the polishing pad.

The material of the polishing pad stacked on the polishing platen is not particularly restricted, and common nonwoven fabric, foamed polyurethane, porous fluororesin and the like can be used as the polishing pad. It is preferable that a groove is formed on the polishing pad such that the polishing slurry is collected.

Though there is no particular restriction on the polishing condition, the rotational speed of the platen is preferably kept low (no higher than 200 rpm) such that the substrate does not come off. The polishing pressure (processing load) at which the surface to be polished, of the substrate, is pressed against the polishing pad is preferably 1 to 100 kPa, and in order to achieve the homogeneity of the polishing rate on the surface to be polished and pattern-flatness in the satisfactory manner, is more preferably 5 to 50 kPa. The polishing slurry of the invention is continually supplied in the space between the polishing pad and the surface to be polished by a pump or the like during polishing. Though there is no restriction on the amount, to be supplied, of the polishing slurry, it is preferable that the surface of the polishing pad is constantly covered with the polishing slurry.

Particularly, a surface to be polished, of a substrate, can be polished by moving a polishing pad relative to the substrate in the state in which the surface to be polished of the substrate is pressed against a polishing pad, while the polishing slurry is supplied onto the polishing pad stacked on the polishing platen. In order to move the polishing pad relative to the substrate, the substrate may be polished by the rotation and fluctuation of the holder in addition to the rotation of the polishing platen. There can be mentioned a polishing method for rotating epicyclically a polishing platen and a polishing method for moving rectilinearly a belt-like polishing pad in one direction of the longitudinal direction. The holder may be in the fixing, rotating or fluctuating state. These polishing methods can be suitably selected by the surface to be polished or the polishing machine as long as the polishing pad is moved relative to the substrate.

When the polishing of the substrate is completed, the substrate is thoroughly washed with flowing water, water drops attached on the substrate were removed by using spin dry or the like, and dried.

Hereinafter, the embodiment of the polishing method of the invention will be explained along with the formation of the wiring layer in the semiconductor device.

First, an interlaminar insulating film made of silicon dioxide or the like are laminated on a silicon substrate. A specified pattern of dented portions (the exposed portion of the substrate) is then formed on the surface of the interlaminar insulating film by the known means such as the formation of a resist layer and etching, and thereby the interlaminar insulating film consisting of the projected portions and the dented portions is formed. The barrier layer such as tantalums coating the interlaminar insulating film along the unevenness of the surface thereof on this interlaminar insulating film is formed by a vapor deposition method or a CVD method or the like. The conductive substance layer such as copper coating the barrier layer such that the dented portions are filled up with the conductive substance is formed by the vapor deposition method, the plating method or the CVD method or the like. It is preferable that the forming thickness of the interlaminar insulating film, the barrier layer and the conductive substance, generally, is about within the range of 0.01 to 2,0 μm, 1 to 100 nm and 0.01 to 2.5 μm.

Next, the conductive substance layer formed on the surface of the semiconductor substrate is polished by CMP using the polishing slurry for the conductive substance of which the polishing rate ratio of the conductive substance/the barrier layer is sufficiently large, for example (first polishing process). Thereby, the barrier layer of the projected portions formed on the substrate is exposed to the surface, and a desired wiring pattern is obtained by leaving the conductive substance layer in the dented portions. The obtained pattern surface can be polished as the surface to be polished for the second polishing process in the polishing method using the polishing slurry of the invention.

In the second polishing process, the polishing slurry of the invention which can polish the conductive substance, the barrier layer and the interlaminar insulating film is used, and at least the exposed barrier layer and the conductive substance formed in the dented portions are polished by chemical machical polishing. The polishing is completed when a desired pattern is obtained in which the section of the barrier layer is exposed to the boundary between the dented portion and the projected portion, the whole of interlaminar insulating film under the barrier layer of the projected portions is exposed, and the conductive substance layer as the wiring layer at the dented portions is left. In order to secure more superior flatness at the time of the polish completion, a part of the interlaminar insulating film of the projected portions may be further polished as over-polishing (when time until a desired pattern can be obtained by the second polishing process is 100 seconds, 50% over-polishing means polishing executed by adding the polishing for 50 seconds to the polishing for 100 seconds).

Thus, an interlaminar insulating film and a second metal wiring are further formed on the metal wiring such as copper formed as described above. After an interlaminar insulating film is formed between the wirings and on the wiring again, similarly, the entire surface of the semiconductor substrate is polished, and is formed as a smooth plane. The semiconductor device having the desired number of wiring layers can be manufactured by repeating the process at a predetermined number.

EXAMPLES

The present invention will be explained further in detail by the following examples hereinafter. It should be noted that the present invention is not restricted by any means to these examples.

Examples 1 to 5, Comparative Examples 1 to 3

[Method for Producing Polishing Slurry]

3.0 percent by weight of colloidal silica polishing particles having an average particle diameter of 70 nm, 1.0 percent by weight of hydrogen peroxide solution (a guaranteed reagent, an aqueous solution of 30 percent by weight), BTA (benzotriazole) as the metal anticorrosive agent and oxidized metal dissolving agent shown in Table 1, in the concentrations (unit: percent by weight) shown in Table 1, and pure water were blended such that the total amount became 100 percent by weight based on the total weight of the polishing slurry. An ammonia water (25%) was added and adjusted such that the pH of the resultant solution was set to pH specified in Table 1, and the polishing slurry used in Examples 1 to 5 and Comparative Examples 1 to 3 was produced.

Polishing substrates were chemically and mechanically polished on following conditions using each polishing slurry produced above.

[Polishing Substrate]

Substrate (A): Silicon substrate having no pattern and having a diameter of 5 inch (12.5 cm)

(a) Silicon substrate on which a tantalum film having a thickness of 200 nm was formed (Film structure: Silicon substrate/Silicon dioxide having a film thickness 300 nm/Tantalum film having a film thickness of 200 nm)

(b) Silicon substrate on which a tantalum nitride film having a thickness of 100 nm was formed (Film structure: Silicon substrate/Silicon dioxide having a film thickness of 300 nm/Tantalum nitride film having a film thickness of 100 nm)

(c) Silicon substrate on which a silicon dioxide film having a thickness of 1 µm was formed (Film structure: Silicon substrate/Silicon dioxide film having a film thickness of 1 µm)

(d) Silicon substrate on which a copper film having a thickness of 1.2 µm was formed (Film structure: Silicon substrate/Silicon dioxide having a film thickness of 300 nm/Barrier layer: Tantalum nitride having a film thickness of 25 nm/Copper having a film thickness of 1.2 µm)

Substrate (B): Silicon substrate having a pattern and having a diameter of 5 inch (12.5 cm) (Silicon substrate on which grooves having a depth of 0.5 µm were formed/Silicon dioxide having a film thickness of 300 nm/Barrier layer: Tantalum nitride having a film thickness of 50 nm/Copper having a film thickness of 1.2 µm)

The above substrate (B) was produced by the following method. Grooves having a wiring density of 50%, wiring width of 0.35 to 100 µm and a depth of 0.5 µm were formed on a silicon substrate, and a silicon dioxide film having a thickness of 300 nm was formed by the known plasma CVD method. A tantalum nitride film having a thickness of 50 nm as the barrier layer was formed by the known spatter method. Similarly, a copper film of 1.2 µm was formed by the spatter method, and the resultant substrate was subjected to the known heat treatment.

As the specific resistance values of the above copper and conductor used for evaluation of the polishing rate and etching rate, a copper film of 1.83 µΩ cm, a tantalum nitride film of 263 µΩ cm and a tantalum film of 184 µΩ cm were used.

[Polishing Condition]

Supply of polishing slurry: 50 cc/minute

Polishing machine: deadweight load type polishing machine for experiment (the diameter of a polishing platen: φ40 cm)

Polishing pad: Foamed polyurethane resin (IC1000, manufactured by Rodel Inc.)

Polishing pressure: 14 kPa

Relative speed of the substrate with respect to the polishing platen: 36 m/min

Rotating rate of a polishing platen: 60 rpm

A resistance meter Model RT-80 (trade name, manufactured by Napson Company) was used for measuring the sheet resistance value for calculating the film thickness before and behind CMP and etching process.

[Evaluation Item of Polishing Slurry]

(1) Etching rate: The etching rate was obtained from the difference in film thickness of the copper layer before or after the immersion of a substrate having a copper film and no pattern in the polishing slurries of Examples and Comparative Examples which were being stirred (room temperature of 25° C., the stirring rate of 100 rpm), which difference in film thickness being converted from the electric resistance.

(2) Polishing rate due to CMP: The difference in film thickness before or after the above substrate (A) (Substrate having no pattern: Silicon substrate having a copper film, tantalum nitride, a tantalum film or a silicon dioxide film) was chemically and mechanically polished for 1 minute was obtained by being converted from the electric resistance.

(3) Magnitude of dishing: Copper was chemically and mechanically polished by using a polishing slurry (trade name: HS-4000, manufactured by Hitachi Chemical Co., Ltd.) until the barrier layer made of tantalum nitride was exposed on the entire surface of the above substrate (B) (first polishing process). The polishing slurry has a sufficiently large polishing rate ratio of copper to tantalum nitride, and is a polishing slurry for copper which contains no polishing particle.

The magnitude of dishing measured at a 100/100 µm pattern portion was 50 nm in the state that the barrier layer was exposed on an insulated film portion after the above first polishing process, and the magnitude of thinning measured at a 4.5/0.5 µm pattern portion was 20 nm. Then, the surface was polished by the polishing slurries of Examples and Comparative Examples until tantalum nitride on the insulated film portion was lost (second polishing process). The substrate was polished for the time obtained by adding 1 minute to the polishing time of tantalum nitride of 50 nm in the polishing rate conversion evaluated by CMP of a tantalum nitride substrate having no pattern.

The reduction in film thickness (magnitude of dishing) of the wiring metal portion to the insulated film portion was then obtained, by using a surface profilometer, from the surface configuration of the stripe-like pattern portion in which the wiring metal portions of 100 µm width and the insulating film portions of 100 µm width were alternately arranged.

(4) Magnitude of thinning: The surface configuration of the stripe-like pattern portion having a total width of 2.5 mm in which wiring metal portions of 4.5 µm width and insulating film portions of 0.5 µm width arranged alternately formed on the substrate in which the above (3) magnitude of dishing was evaluated was measured by using the surface profilometer. The reduction in film thickness of the insulated film portion near the center of the pattern to the insulating film field portion around the stripe-like pattern was then obtained.

(5) Corrosion: The surface to be polished after evaluating the above (4) magnitude of thinning was observed with 1000 magnifications using a microscope (trade name: AL-2000, manufactured by Olympus Optical Co., Ltd.), and presence/absence of generation of foreign matterlike projections was evaluated.

The evaluation results (the polishing rate of the various films by CMP, the etching rate of copper, the magnitude of dishing, the magnitude of thinning and presence/absence of corrosion) in Examples 1 to 5 and Comparative Examples 1 to 3 were shown in Table 1.

TABLE 1

| Example No. unit | oxidized metal dissolving agent wt % | BTA wt % | pH | CMP polishing rate(nm/min) | | | |
|---|---|---|---|---|---|---|---|
| | | | | Cupper | Tantalum | Tantalum nitride | Silicon dioxide |
| Example | | | | | | | |
| 1 | succinic acid 0.6 | 0.15 | 3.13 | 16.0 | 45.0 | 63.5 | 15.5 |
| 2 | lactic acid 0.05 | 0.15 | 3.05 | 8.0 | 24.3 | 38.0 | 15.0 |
| 3 | adipic acid 0.6 | 0.10 | 3.23 | 12.0 | 35.5 | 53.5 | 16.0 |
| 4 | glutaric acid 0.6 | 0.10 | 3.18 | 14.0 | 39.5 | 56.5 | 14.8 |
| 5 | glutaric acid 0.6 | 0.15 | 3.55 | 12.5 | 29.5 | 48.5 | 15.0 |
| Comparative Example | | | | | | | |
| 1 | oxalic acid 0.15 | 0.2 | 2.40 | 33.5 | 31.5 | 42.5 | 15.2 |
| 2 | malic acid 0.5 | 0.2 | 3.70 | 17.0 | 15.0 | 29.8 | 14.8 |
| 3 | succinic acid 0.6 | 0.15 | 4.10 | 3.5 | 10.0 | 19.5 | 14.5 |

| Example No. unit | oxidized metal dissolving agent wt % | Cupper etching rate nm/min | Magnitude of dishing nm | Magnitude of thinning nm | Corrosion of Cupper wiring — |
|---|---|---|---|---|---|
| Example | | | | | |
| 1 | succinic acid 0.6 | 0.3 | 20 | 30 | absence |
| 2 | lactic acid 0.05 | 0.6 | 35 | 30 | absence |
| 3 | adipic acid 0.6 | 0.1 | 25 | 25 | absence |
| 4 | glutaric acid 0.6 | 0.2 | 25 | 25 | absence |
| 5 | glutaric acid 0.6 | 0.0 | 40 | 30 | absence |
| Comparative Example | | | | | |
| 1 | oxalic acid 0.15 | 30.0 | 80 | 60 | presence |
| 2 | malic acid 0.5 | 0.2 | 65 | 40 | absence |
| 3 | succinic acid 0.6 | 0.1 | 55 | 35 | absence |

An organic acid of which the pKa was small was used in the Comparative Example 1. Since the pH of the polishing slurry was low, the polishing rate of copper was large, and the flatness characteristic such as dishing and thinning was inferior. In addition, when the substrate having the pattern was polished, corrosion was found at the copper wiring portion. Since an organic acid of which the pKa was comparatively small was used and the pH was adjusted to pKa or more in the Comparative Example 2, the polishing rate of the tantalum system conductor was small and the flatness characteristic was also inferior. Though an acid of which the pKa was 3.5 or more was used in the Comparative Example 3, since the pH was adjusted to 4 or more, the polishing rate of the tantalum system conductor was small and flatness efficiency was also inferior.

On the other hand, in Examples 1 to 5, the high polishing rate, excellent dishing and thinning characteristics of the tantalum system conductor were obtained.

INDUSTRIAL APPLICABILITY

According to the invention, in the wiring-formation process of the semiconductor device, the high polishing rate of the conductor used for the barrier layer can be realized by the polishing slurry having low polishing particle concentration and low metal anticorrosive agent concentration. The occurrence of the dishing and thinning of the metal wiring is reduced by suppressing the etching of the metal for wiring, and highly reliable embedding wiring pattern of the metal film can be formed. According to the polishing slurry and polishing method of the invention, the high-reliability semiconductor device and apparatus which are excellent in miniaturization, thin film, dimensional accuracy and electrical characteristic can be suitably manufactured.

The invention claimed is:

1. A polishing method for polishing a material comprising:
   a substrate,
   an interlaminar insulating film on said substrate, wherein a surface of said interlaminar insulating film comprises dented portions and projected portions,
   a barrier conductor layer coated along said surface of said interlaminar insulating film, wherein said barrier conductor layer comprises dented portions and projected portions corresponding to the dented portions and projected portions of said interlaminar insulating film,
   a conductive substance layer coated on said barrier conductor layer, wherein said conductive substance layer fills the dented portions of said barrier conductor layer and covers the projected portions of said barrier conductor layer,
   said method comprising:
   a first polishing step of polishing said conductive substance layer to expose projected portions of said barrier conductor layer; and
   a second polishing step of chemically polishing and mechanically polishing at least the exposed projected portions of said barrier conductor layer and the conductive substance layer while supplying a polishing slurry to expose the interlaminar insulating film at locations corresponding to the projected portions of said interlaminar insulating film, with conductive substance layer at the dented portions of said barrier conductor layer remaining;

said polishing slurry comprising:

a metal-oxidizing agent; a metal anticorrosive agent; an oxidized metal dissolving agent; and water, wherein the oxidized metal dissolving agent is at least one kind selected from the group consisting of an acid in which the negative value of the logarithm of the dissociation constant Ka (pKa) of a first dissociable acid group is 3.5 or more, an ammonium salt of the acid and an organic acid ester of the acid, the pH of the polishing slurry is within the range of 3 to 4, and the concentration of the metal-oxidizing agent is within the range of 0.01 to 3 percent be weight.

2. The polishing method of claim 1, wherein the barrier conductor layer prevents the conductive substance from diffusing to the interlaminar insulating film, and the conductive substance is at least one of copper and a copper alloy.

3. The polishing method of claim 1, wherein the barrier conductor layer is a single layer made of one kind or a lamination layer made of two kinds or more selected from the group consisting of tantalum, tantalum nitride, a tantalum alloy, titanium, titanium nitride, a titanium alloy, tungsten, tungsten nitride and a tungsten alloy.

4. The polishing method of claim 1, wherein the concentration of the oxidizing agent is within the range of 0.01 to 1.5 percent by weight.

5. The polishing method of claim 1, wherein the oxidized metal dissolving agent is an organic acid.

6. The polishing method of claim 1, wherein said dented portions and projected portions are formed in a specified pattern.

7. The polishing method of claim 6, wherein said dented portions are formed on the surface of the interlaminar insulating film by forming a resist layer and etching.

8. A polishing method of polishing a material comprising:
a substrate,
an interlaminar insulating film on said substrate, wherein a surface of said interlaminar insulating film comprises dented portions and projected portions,
a barrier conductor layer coated along said surface of said interlaminar insulating film, wherein said barrier conductor layer comprises dented portions and projected portions corresponding to the dented portions and projected portions of said interlaminar insulating film,
a conductive substance layer coated on said barrier conductor layer, wherein said conductive substance layer fills the dented portions of said barrier conductor layer and covers the projected portions of said barrier conductor layer,
said method comprising:
a first polishing step of polishing said conductive substance layer to expose projected portions of said barrier conductor layer; and
a second polishing step of chemically polishing and mechanically polishing at least the exposed projected portions of said barrier conductor layer and the conductive substance layer while supplying a polishing slurry to expose the interlaminar insulating film at locations corresponding to the projected portions of said interlaminar insulating film, with conductive substance layer at the dented portions of said barrier conductor layer remaining, said polishing slurry comprising:
a metal-oxidizing agent; a metal anticorrosive agent; an oxidized metal dissolving agent; and water, wherein the oxidized metal dissolving agent is at least one kind selected from the group consisting of an acid in which the negative value of the logarithm of the dissociation constant Ka (pKa) of a first dissociable acid group is 3.5 or more, an ammonium salt of the acid and an organic acid ester of the acid, the pH of the polishing slurry is within the range of 3 to 4 and the concentration of the metal-oxidizing agent is within the range of 0.01 to 3 percent by weight, and wherein the barrier layer is selected from the group consisting of tantalum compounds and titanium compounds.

9. The polishing slurry of claim 8, wherein the barrier layer is selected from the group consisting of tantalum, tantalum nitride, tantalum alloys, titanium, titanium nitride and titanium alloys.

10. A polishing method for polishing a material comprising:
a substrate,
an interlaminar insulating film on said substrate, wherein a surface of said interlaminar insulating film comprises dented portions and projected portions,
a barrier conductor layer coated along said surface of said interlaminar insulating film wherein said barrier conductor layer comprises dented potions and projected portions corresponding to the dented portions and projected portions of said interlaminar insulating film,
a conductive substance layer coated on said barrier conductor layer, wherein said conductive substance layer fills the dented portions of said barrier conductor layer and covers the projected portions of said barrier conductor layer,
said method comprising:
a first polishing step of polishing said conductive substance layer to expose projected portions of said barrier conductor layer; and
a second polishing step of chemically polishing and mechanically polishing at least the exposed projected portions of said barrier conductor layer and the conductive substance layer while supplying a polishing slurry to expose the interlaminar insulating film at locations corresponding to the projected portions of said interlaminar insulating film, with conductive substance layer at the dented portions of said barrier conductor layer remaining, said polishing slurry comprising:
a metal polishing slurry comprising:
a metal-oxidizing agent: a metal anticorrosive agent; an oxidized metal dissolving agent; and water, wherein the oxidized metal dissolving agent is at least one kind selected from the group consisting of an acid in which the negative value of the logarithm of the dissociation constant Ka (pKa) of a first dissociable acid group is 3.5 or more an ammonium salt of the acid and an organic acid ester of the acid, the pH of the polishing slurry is within the range of 3 to 3.75, and the concentration of the metal-oxidizing agent is within the range of 0.01 to 3 percent by weight.

11. A polishing method of polishing a material comprising:
a substrate,
an interlaminar insulating film on said substrate, wherein a surface of said interlaminar insulating film comprises dented portions and projected portions, a barrier conductor layer coated along said surface of said interlaminar insulating film, wherein said barrier conductor layer comprises dented portions and projected portions corresponding to the dented portions and projected portions of said interlaminar insulating film, a conductive substance layer coated on said barrier conductor layer, wherein said conductive substance layer fills the dented portions of said barrier conductor layer and covers the projected portions of said barrier conductor layer, said method comprising:

a first polishing step of polishing said conductive substance layer to expose projected portions of said barrier conductor layer; and a second polishing step of chemically polishing and mechanically polishing at least the exposed projected portions of said barrier conductor layer and the conductive substance layer while supplying a polishing slurry to expose the interlaminar insulating film at locations corresponding to the projected portions of said interlaminar insulating film, with conductive substance layer at the dented portions of said barrier conductor layer remaining, said polishing slurry comprising:

a metal-oxidizing agent, a metal anticorrosive agent, an oxidized metal dissolving agent, and water, wherein the oxidized metal dissolving agent is at least one kind selected from the group consisting of an acid in which the negative value of the logarithm of the dissociation constant Ka (pKa) of a first dissociable acid group is 3.5 or more, an ammonium salt of the acid and an organic acid ester of the acid, the pH of the polishing slurry is within the range of 3 to 4, and the concentration of the metal-oxidizing agent is within the range of 0.01 to 3 percent by weight, and wherein the polishing slurry contains polishing particles having an average particle diameter of 100 nm or less.

* * * * *